(12) United States Patent
Finlay

(10) Patent No.: US 10,439,638 B2
(45) Date of Patent: *Oct. 8, 2019

(54) PAGE FILTERING VIA COMPRESSION DICTIONARY FILTERING

(71) Applicant: INTERNATIONAL BUSINESS MACHINES CORPORATION, Armonk, NY (US)

(72) Inventor: Ian R. Finlay, Uxbridge (CA)

(73) Assignee: International Business Machines Corporation, Armonk, NY (US)

( * ) Notice: Subject to any disclaimer, the term of this patent is extended or adjusted under 35 U.S.C. 154(b) by 103 days.

This patent is subject to a terminal disclaimer.

(21) Appl. No.: 15/696,304

(22) Filed: Sep. 6, 2017

(65) Prior Publication Data

US 2017/0371973 A1 Dec. 28, 2017

Related U.S. Application Data (63) Continuation of application No. 15/194,635, filed on Jun. 28, 2016.

(51) Int. Cl.
*G06F 16/30* (2019.01)
*H03M 7/30* (2006.01)
*G06F 16/22* (2019.01)

(52) U.S. Cl.
CPC .......... *H03M 7/60* (2013.01); *G06F 16/2282* (2019.01); *H03M 7/3088* (2013.01)

(58) Field of Classification Search
USPC ....................................................... 707/756
See application file for complete search history.

(56) References Cited

U.S. PATENT DOCUMENTS 5,442,350 A 8/1995 Iyer et al.
6,170,047 B1 1/2001 Dye
(Continued)

FOREIGN PATENT DOCUMENTS

CN 1770150 A 5/2006
CN 1904882 A 1/2007
(Continued)

OTHER PUBLICATIONS

Mishra, "Data Compression: Strategy, Capacity Planning and Best Practices," Microsoft SQL Server 2008, https://technet.microsoft.com/en-us/library/dd894051%28v=sql.100%29.aspx, Published May 2009, Printed on Feb. 27, 2016, pp. 1-17.
(Continued)

*Primary Examiner* — Hicham Skhoun
(74) *Attorney, Agent, or Firm* — Ewa M. Wozniak (57) ABSTRACT

Page filtering in a database using a compression dictionary. A page of a database table is compressed, creating a compression dictionary. The compression dictionary includes entries with a byte sequence from the page and a compression symbol associated with the byte sequence. A part of the compressed page, the compression dictionary, and a page symbol list with compression symbols from the dictionary present in the part of the page, are received. A query having a predicate with a predicate value is received. A predicate symbol list, including symbols in the dictionary whose byte sequences at least partially match the predicate value, is generated. Based on the predicate symbol list and the page symbol list, it is determined that at least one symbol from the predicate symbol list is also present in the part of the page. The query is performed by evaluating the predicate on the part of the page.

6 Claims, 3 Drawing Sheets

(56) References Cited

U.S. PATENT DOCUMENTS

| | | | |
|---|---|---|---|
| 6,370,631 | B1 | 4/2002 | Dye |
| 6,614,368 | B1 | 9/2003 | Cooper |
| 7,051,152 | B1 | 5/2006 | Danilak |
| 7,526,607 | B1 | 4/2009 | Singh et al. |
| 8,126,855 | B2 | 2/2012 | Faerber et al. |
| 2002/0109615 | A1 | 8/2002 | Abdat |
| 2005/0210023 | A1 | 9/2005 | Barrera et al. |
| 2006/0098031 | A1 | 5/2006 | Lai et al. |
| 2008/0294863 | A1* | 11/2008 | Faerber ............... H03M 7/3084 711/170 |
| 2010/0049730 | A1* | 2/2010 | Qiao ................ G06F 16/24539 707/756 |
| 2010/0121826 | A1 | 5/2010 | Mitsuhashi |
| 2010/0161650 | A1* | 6/2010 | Chaitanya ......... G06F 16/24552 707/769 |
| 2010/0223237 | A1 | 9/2010 | Mishra et al. |
| 2010/0228800 | A1 | 9/2010 | Aston et al. |
| 2010/0281004 | A1* | 11/2010 | Kapoor ............ G06F 16/24561 707/693 |
| 2010/0318839 | A1 | 12/2010 | Avila et al. |
| 2010/0328115 | A1 | 12/2010 | Binnig et al. |
| 2011/0078134 | A1* | 3/2011 | Bendel .................... G06F 16/22 707/713 |
| 2011/0270862 | A1 | 11/2011 | Tamiya |
| 2011/0307521 | A1 | 12/2011 | Slezak et al. |
| 2011/0320446 | A1 | 12/2011 | Chakrabarti et al. |
| 2012/0054225 | A1 | 3/2012 | Marwah et al. |
| 2012/0130965 | A1 | 5/2012 | Oh |
| 2012/0209873 | A1 | 8/2012 | He |
| 2012/0246153 | A1 | 9/2012 | Pehle |
| 2012/0323929 | A1 | 12/2012 | Kimura et al. |
| 2012/0330908 | A1 | 12/2012 | Stowe et al. |
| 2013/0073530 | A1 | 3/2013 | Faerber et al. |
| 2013/0103655 | A1 | 4/2013 | Fanghaenel et al. |
| 2013/0238865 | A1 | 9/2013 | Kataoka et al. |
| 2014/0181052 | A1* | 6/2014 | Moore ................ G06F 16/2365 707/687 |
| 2015/0081650 | A1 | 3/2015 | Lyle |
| 2015/0081651 | A1 | 3/2015 | Lyle |
| 2015/0286683 | A1* | 10/2015 | Zhou .................. G06F 16/2456 707/693 |
| 2015/0317327 | A1 | 11/2015 | He et al. |
| 2016/0006454 | A1* | 1/2016 | Kataoka .................. H03M 7/30 341/87 |
| 2016/0118998 | A1 | 4/2016 | Finlay |
| 2017/0017021 | A1 | 1/2017 | Tokinoya et al. |

FOREIGN PATENT DOCUMENTS

| | | |
|---|---|---|
| CN | 102917020 B | 2/2013 |
| CN | 104462176 A | 3/2015 |
| JP | 6004453 B2 | 10/2016 |

OTHER PUBLICATIONS

IBM, "A Method and System for Enabling Sub-Row Compression in a Table," An IP.com Prior Art Database Technical Disclosure, Original Publication Date: Feb. 15, 2010, IP.com No. IPCOM000193236D, IP.com Electronic Publication Date: Feb. 15, 2010, pp. 1-2.
Pending U.S. Appl. No. 14/520,485, filed Oct. 22, 2014, titled "Predicate Application Through Partial Compression Dictionary Match," pp. 1-28.
Pending U.S. Appl. No. 14/685,947, filed Apr. 14, 2015, titled "Predicate Application Through Partial Compression Dictionary Match," pp. 1-24.
Nabina, A. et al.; "Dynamic Reconfiguration Optimisation with Streaming Data Decompression"; 2010 International Conference on Field Programmable Logic and Applications; IEEE, 2010, pp. 602-607.
Tripney, Brian G. et al. "Data value storage for compressed semi-structured data." H. Decker et al. (Eds.): DEXA 2013, Part II, LNCS 8056, Springer-Verlag Berlin Heidelberg 2013. pp. 174-188.
Abadi, Daniel J. et al. "Integrating compression and execution in column-oriented database systems." SIGMOD 2006, Jun. 27-29, 2006, Chicago, Illinois, USA. 12 pp.
Amir et al.; "Let Sleeping Files Lie: Pattern Matching in Z-Compressed Files"; Journal of Computer and System Sciences 52, 299-307, Article 0023; 1996.
Tao et al. "Pattern Matching in LZW Compressed Files"; IEEE Transactions on Computers, vol. 54, No. 8; Aug. 2005, pp. 929-307.
Pending U.S. Appl. No. 14/032,122, filed Sep. 19, 2013, entitled: "Data Access Performance Using Decompression Maps", pp. 1-21.
Pending U.S. Appl. No. 14/307,838, filed Jun. 18, 2014, entitled: "Data Access Performance Using Decompression Maps", pp. 1-19.
IBM, List of IBM Patents or Patent Applications Treated as Related, Appendix P, dated Sep. 7, 2017, 2 pages.
Pending U.S. Appl. No. 15/194,635, filed Jun. 28, 2017, entitled: "Page Filtering Via Compression Dictionary Filtering", 35 pages.
Pending U.S. Appl. No. 15/604,210, filed May 24, 2017, entitled: "Data Access Using Decompression Maps", pp. 1-20.
Pending U.S. Appl. No. 15/604,239, filed May 24, 2017, entitled: "Data Access Using Decompression Maps", pp. 1-19.
Amihood, A. et al.; "Let Sleeping Files Lie: Pattern Matching in Z-Compressed Files"; Journal of Computer and System Sciences 52, 299-307, Article 0023; 1996.
Chen et al., "Query Optimization in Compressed database systems", Newsletter; ACM SIGMOD Record Homepage; vol. 30, Issue 2, Jun. 2001; pp. 271-282; ACM New York, NY, USA.
Fusco et al; "RasterZip: Compressing Network Monitoring Data with Support for Partial Decompression;" IMC '12 Proceedings of the 2012 ACM conference on Internet measurement conference; Nov. 14-16, 2012; ACM Copyright 2012. pp. 1-14.
USPTO Office Action; U.S. Appl. No. 14/032,122; Notification Date: Feb. 18, 2016.
USPTO Office Action; U.S. Appl. No. 14/032,122; Notification Date: Mar. 2, 2017.
USPTO Office Action; U.S. Appl. No. 14/032,122; Notification Date: Jun. 1, 2016.
USPTO Office Action; U.S. Appl. No. 14/032,122; Notification Date: Sep. 15, 2016.
USPTO Office Action; U.S. Appl. No. 14/307,838; Notification Date: Feb. 18, 2016.
USPTO Office Action; U.S. Appl. No. 14/307,838; Notification Date: Mar. 3, 2017.
USPTO Office Action; U.S. Appl. No. 14/307,838; Notification Date: Jun. 7, 2016.
USPTO Office Action; U.S. Appl. No. 14/307,838; Notification Date: Sep. 15, 2016.
USPTO Office Action; U.S. Appl. No. 14/520,485; Notification Date: Jan. 11, 2017.
USPTO Office Action; U.S. Appl. No. 14/685,947; Notification Date: Jan. 11, 2017.
USPTO Office Action; U.S. Appl. No. 15/604,239; Notification Date: Feb. 20, 2018.
USPTO Office Action; U.S. Appl. No. 15/604,239; Notification Date: Sep. 4, 2018.
USPTO Office Action; U.S. Appl. No. 15/604,239; Notification Date: Feb. 5, 2019.
USPTO Office Action; U.S. Appl. No. 15/604,210; Notification Date: Feb. 14, 2018.
USPTO Office Action; U.S. Appl. No. 15/604,210; Notification Date: Sep. 4, 2018.
USPTO Office Action; U.S. Appl. No. 15/604,210; Notification Date: Feb. 5, 2019.
IBM: List of IBM Patents or Patent Applications Treated As Related (Appendix P), May 1, 2019, pp. 1-2.

* cited by examiner

PAGE FILTERING VIA COMPRESSION DICTIONARY FILTERING

BACKGROUND

The present invention relates generally to the field of database query optimization, and more particularly to fast evaluation of predicates against compressed data.

SUMMARY

Embodiments of the present invention disclose a computer-implemented method, computer program product, and system for page filtering in a database using a compression dictionary. A page of a database table is compressed, which creates a compression dictionary. The compression dictionary includes entries that include a byte sequence from the page and a compression symbol associated with the byte sequence. A part of the compressed page and the compression dictionary are received. A page symbol list that includes compression symbols from the compression dictionary that are present in the part of the page is received. A query, which includes a predicate having a predicate value, is received. A predicate symbol list for the predicate, including compression symbols in the compression dictionary whose associated byte sequences at least partially match the predicate value, is generated. Based on the predicate symbol list and the page symbol list, it is determined that at least one compression symbol from the predicate symbol list is also present in the part of the page. The query is performed by evaluating the predicate on the part of the page.

DETAILED DESCRIPTION

A relational database is a computer-implemented database whose organization is based on the relational model of data. This model organizes data into one or more tables, or relations, of rows and columns, with a unique key for each row. Generally, each entity type described in a database has its own table, the rows representing instances of that type of entity and the columns representing values attributed to that instance. Software systems used to maintain relational databases are known as Relational Database Management Systems (RDBMS). The relational model for database management is based on first-order predicate logic. A predicate is a statement or an expression that can evaluate to true or false. In the relational model predicates may act as filters in selecting rows that satisfy a query. For example, in the query SELECT*FROM ZIPtable WHERE ZIPcode="90120"

the predicate '=' in the WHERE clause selects all rows in ZIPtable with a value in the ZIPcode column equal to 90120.

Another example is the LIKE predicate, which searches for column values that contain a specified pattern of characters. A typical usage is:

SELECT*FROM ZIPtable WHERE ZIPcode LIKE "9012%"

which selects all rows in ZIPtable with ZIPcode column value starting with 9012. In the above examples, the expression after the word WHERE is referred to as a search condition and the value after the predicate is referred to as a predicate value. Columns, such as ZIPcode, appearing in a search condition are referred to herein as search columns. Relational database systems typically use SQL (Structured Query Language) as the language for querying and maintaining the database.

In the above examples, WHERE is an element of a clause in a query that uses a predicate such as = or LIKE, to filter the rows retrieved by a SELECT statement from a database table. Relational databases may employ various other query clauses to filter rows, for example ON, HAVING, FILTER, and QUALIFY. In what follows, the term match predicate refers to a predicate in a search condition, such as =, LIKE, IN, etc., that is true if there is a match between the predicate value and the column value specified in the query. This may exclude certain predicates such as < or BETWEEN.

In a typical SQL database, the fundamental unit of data storage is the page, or block. The disk space allocated to a data file in a database is logically divided into pages numbered consecutively. Disk I/O operations are performed at the page level. That is, the database server reads or writes whole pages. Data pages include data rows of a table, typically put on the page serially, starting immediately after a header with control information.

Dictionary based compression algorithms are lossless compression methods that scan data to create a dictionary in memory of sequences of bytes, looking for repeated information. Some implementations use a static dictionary that does not have to be built or maintained dynamically. Based on pattern recognition, involving a look-up in the dictionary, character strings or other byte sequences are replaced by shorter, but uniquely identifiable, data elements, called symbols (or sometimes tokens). An entry in the compression dictionary includes a character string or other byte sequence and an associated symbol, which may be an index into the dictionary. This results in reversible compression of the overall data. The Lempel-Ziv (LZ) algorithms are examples of dictionary based compression schemes, of which the best known is Lempel-Ziv-Welch (LZW).

For example, with LZW compression for standard text, the compression dictionary is typically initialized to contain the single-character strings corresponding to all the possible input characters. The compression algorithm scans the input text for successively longer substrings until it finds one that is not yet in the dictionary. When such a string is found, the index for the string without the last character, i.e., the longest substring that is already in the dictionary, is retrieved from the dictionary and the new string, including the last character, is added to the dictionary with the next available code. The last input character is then used as the next starting point to scan for further substrings. In this way, successively longer strings are stored in the dictionary and made available for subsequent encoding as single symbols.

An RDBMS may employ data compression to reduce the disk storage requirements of the database. For example, IBM® DB2® 10.1 offers a storage optimization feature, which uses a combination of compression techniques, including row compression via a variant of the LZW algorithm, to compress data on disk and thus decrease disk space and storage infrastructure requirements. Since disk storage systems can often be some of the most expensive components of a database solution, even a small reduction in the storage subsystem can result in substantial cost savings for the overall database solution.

Moreover, because compression enables the storage of more rows per page, fewer pages must be read to access the same amount of data. Therefore, queries on a compressed table need fewer I/O operations to access the same amount of data. Also, since there may be more rows of data on a buffer pool page, the likelihood that needed rows are in the buffer pool increases. For this reason, compression can improve performance through improved buffer pool hit ratios (a buffer pool caches pages in main memory; the buffer pool hit ratio is a measure of how often a page access is satisfied without requiring an I/O operation). In a similar way, compression can also speed up backup and restore operations, as fewer pages need to be transferred to backup or restore the same amount of data.

Compression schemes such as LZW are usually applied to a database table at the row level, and sometimes at the page level. It should be noted that row compression typically examines rows looking for patterns across the entire row, rather than at a column level. Thus, a symbol in a compression dictionary can span multiple columns. When a query requires applying a predicate to a compressed database table, rows or pages are typically first decompressed, specific columns are located within rows, and finally the predicate is applied to the decompressed data. Decompression may expand rows or pages to several times their compressed size, and typically also involves repeated dictionary lookups and copying of dictionary entries into a buffer when reconstructing a page or row. This not only consumes CPU resources, but also may require excess memory and/or cache storage.

Various methods are known or have been proposed for evaluating predicates in a query without first decompressing rows in a database table. However, it may still be necessary to search a large portion of the compressed data to find rows that may contain a match for the predicate. Therefore, it would be advantageous to have techniques that reduce the overhead in qualifying predicates in compressed data when only a part of the compressed data needs to be accessed.

In the following, all trademarks and registered trademarks are the property of their respective owners.

Dictionary-based compression has become common in database systems. When, for example, a compressed row is examined to see if it qualifies a predicate, the row is typically first decompressed, specific columns are located within the row, and finally the predicate is applied to the decompressed data. As mentioned above, the process of decompressing is CPU intensive, and generally carries a high overhead.

A database table typically has one table-level compression dictionary, which contains entries that apply to the entire table, but it may also have one or more page-level compression dictionaries that apply to a single page of the database table. Typically, a table-level compression dictionary is created from a subset of the data in the table, and it is static, while page-level compression dictionaries are dynamically maintained as rows are added, deleted, or updated in the table.

In what follows, the symbol, or token, included in a compression dictionary entry is referred to as a compression symbol, or simply symbol. The character string or other byte sequence included in a compression dictionary entry is referred to as a compression string.

Recent improvements to predicate evaluation on compressed data in a database suggest using knowledge of the length of compression strings in a compression dictionary to locate those symbols that cover a byte range where columns of interest may be located, and then decompress just those symbols covered by the range of the columns. Alternatively, a list of compression dictionary symbols of interest may be built, based on the predicate values being searched for. Approaches such as these may be extended to improve the way predicates are applied to compressed data, for example, by identifying partial predicate matches, compression strings in a compression dictionary that partially match a predicate. For example, a suffix, or sequence of trailing characters, of a compression string may match a prefix, or sequence of leading characters, of the predicate value, with other compression strings completing the pattern; or a prefix of the compression string may match a suffix of the predicate value, with other compression strings completing the pattern; or the predicate value may be a subsequence of the compression string. The set of symbols associated with the partial matches identified in this way may be compared with the symbols present in the compressed data to facilitate evaluating the predicate on the compressed data.

Embodiments of the present invention disclose a computer-implemented method, computer program product, and system for page filtering in a database using a compression dictionary. When a table-level compression dictionary is in use, current methods for predicate evaluation may be improved by adding a per page record of which compression symbols appear on each page in a database table. In conjunction with another list of compression symbols that may qualify one or more predicates, the list of page symbols may be searched, and if one or more of the symbols are found to be in use on the page, then the page can be searched for matches using an existing or proposed method. In particular, decompression may be restricted to those pages which were found to contain possible matches for the predicate, based on a comparison of the two symbol lists. Otherwise, the page may be skipped. An extension to this method includes subdividing a page into regions with separate lists of compression symbols for each region, and searching only regions of a page based on the compression symbols present in that region. Similarly, multiple pages may be cataloged, or combined, into a page symbol list, and multiple pages may then be filtered, based on the compression symbols required to be present in order for rows to exist on these pages that may qualify one or more predicates.

In one embodiment of the present invention, a first bit vector, or page symbol vector, with each bit position corresponding to an entry in the compression dictionary, may be used. The page symbol vector may have a 1 bit in each position corresponding to a compression symbol in use on the page. Alternatively, the page symbol vector may employ, for example, alphabetic, numeric, or alphanumeric strings, or Boolean values, such as 0/1 or Yes/No, to indicate the presence or absence of compression symbols on the page. The page symbol vector may be generated, for example, when the page is compressed. The page symbol vector may be stored on the page itself, or in a central location, for example as metadata.

When a list of predicate symbols that may provide at least a partial match to a given predicate value has been constructed, as described below, a second bit vector, a predicate symbol vector, may be used. The predicate symbol vector may have bit positions corresponding to entries in the compression dictionary, with a 1 bit in each bit position corresponding to a symbol that may be involved in a predicate application. Alternatively, the predicate symbol vector may employ, for example, alphabetic, numeric, or alphanumeric strings, or Boolean values, such as 0/1 or Yes/No, to indicate compression symbols that may be involved in a predicate application. The predicate symbol vector may be applied per page, for example, via a logical AND operation (i.e., page symbol vector AND predicate symbol vector), and if any predicate symbol vector bits that are 1 are found to be 1 in the page symbol vector, indicating that symbols of interest may be in use on the page, then the page may be searched for a match using an appropriate search method. This process may be extended to multiple predicate symbol vectors, one per set of symbols required to apply the predicates, and thus the page may only need to be searched if the full set of predicate symbol vector bits is found in the page symbol vector (e.g., if page symbol vector AND predicate symbol vector !=0). Similarly, a set of predicate symbol lists may be filtered, based on which symbol sets appear on a page.

In an embodiment of the invention, a predicate symbol list, including compression symbols that provide at least a partial match to a given predicate value is constructed. The notion of a partial match is illustrated via the following examples.

Table 1 depicts part of an example compression dictionary for a database table t1 (not shown). Table 1 includes symbols S1, S2, and S3, with associated compression strings:

TABLE 1

PARTIAL COMPRESSION DICTIONARY

| SYMBOL | COMPRESSION STRING |
|---|---|
| S1 | "abcdefgh" |
| S2 | "ijklmnopq" |
| S3 | "rstuvwxyz" |
| . . . | . . . |

Suppose that an example query for database table t1 is given by:

SELECT*FROM t1WHERE col1=*'fghxyz'*

In this query the search condition specifies that the value in column col1 should match the string "fghxyz". A search of the compression dictionary entries in Table 1 yields a partial match, "fgh", for the predicate value "fghxyz" at the end of S1's string, and another partial match, "xyz", at the end of S3's string. Since "fgh" is a prefix of the predicate value, a potential match could occur when S1 is found. However, with S3, because the compression string has "xyz" as a suffix, there cannot be a match. Therefore, in this case, it makes sense to search for either S1 or for non-compressed characters "f", "g", "h", "x", "y", and "z" (or their associated symbols).

Similarly, if the compression string for symbol Si is found, followed by the non-compressed byte sequence "xyz", then there is a potential column match for the predicate value. With additional knowledge of the column positions of compression symbols, it may be possible to exactly match the predicate value to the compressed data, without having to decompress the data.

In another example using database table t1 and the compression dictionary of Table 1, suppose the query is:

SELECT*FROM t1 WHERE col1=*'hijklmnopqrst'*

A search of the entries in Table 1 yields not only a suffix "h" for S1's compression string and a prefix "rst" for S3's string, but also a partial match for the S2's string "ijklmnopqr" within the predicate value. Since this last string is a substring of the predicate value, a potential match could occur where S2 is found. This information may be used to create a search list for possible exact matches, for example: S1, S2, S3; or S1, S2, and the non-compressed sequence "rst"; or the non-compressed character "h", S2, S3; or the non-compressed character "h", S2, and the non-compressed sequence "rst". Depending on the compression method used, single-character symbols may replace non-compressed characters in this example.

A further example illustrates a full dictionary match with database table t1 and the compression dictionary of Table 1. Suppose the query is:

SELECT*FROM t1 WHERE col1=*'abcdefgh'*

A search of the dictionary entries yields an exact match for the predicate value in the compression string for S1. If S1 is found in the compressed data and if it is at the column boundary/position for column coli, then a qualifying row for the above query has been found. It is further possible to determine from an examination of the compression dictionary, with knowledge of the column(s) in which the compression string is found, that the only place where "abcdefgh" can occur is where S1 is located. Since there is no overlap with any other compression string, there is no need to also search for components from uncompressed data.

As another example, consider yet again database table t1 and the compression dictionary of Table 1 with the query:

SELECT*FROM t1 WHERE col1=*'cde'*

A search of the dictionary entries yields an exact match for the predicate value in the compression string for symbol S1. As with the previous example, it is known that if S1 is found in the compressed data, and it is in the correct position/offset in the row, that a match for the predicate value has been found. However, in contrast to the previous example, this is not the only form of the predicate value that needs to be searched for in the compressed data. It is possible for the byte sequence to exist with other combinations of values before or after "cde", so it is also necessary to search for the non-compressed string "cde".

In an embodiment of the invention, information may be added to a compression dictionary that indicates, for each symbol in the compression dictionary, which columns in a database table may contain the symbol. This information may be, for example, a list of columns or a bit vector with bit positions corresponding to columns covered by the symbol. The method may be further refined to track which bytes of a column correspond to the bytes of the symbol (e.g., using offset and length pairs, or any other convenient representation), or which bytes of the symbol correspond to which bytes in the columns. With this knowledge, if a predicate symbol list, with symbols that may provide at least a partial match to a predicate value, is available, then a symbol can be further qualified, based on the columns it covers, which may reduce the searchable symbol list.

Figure 1:
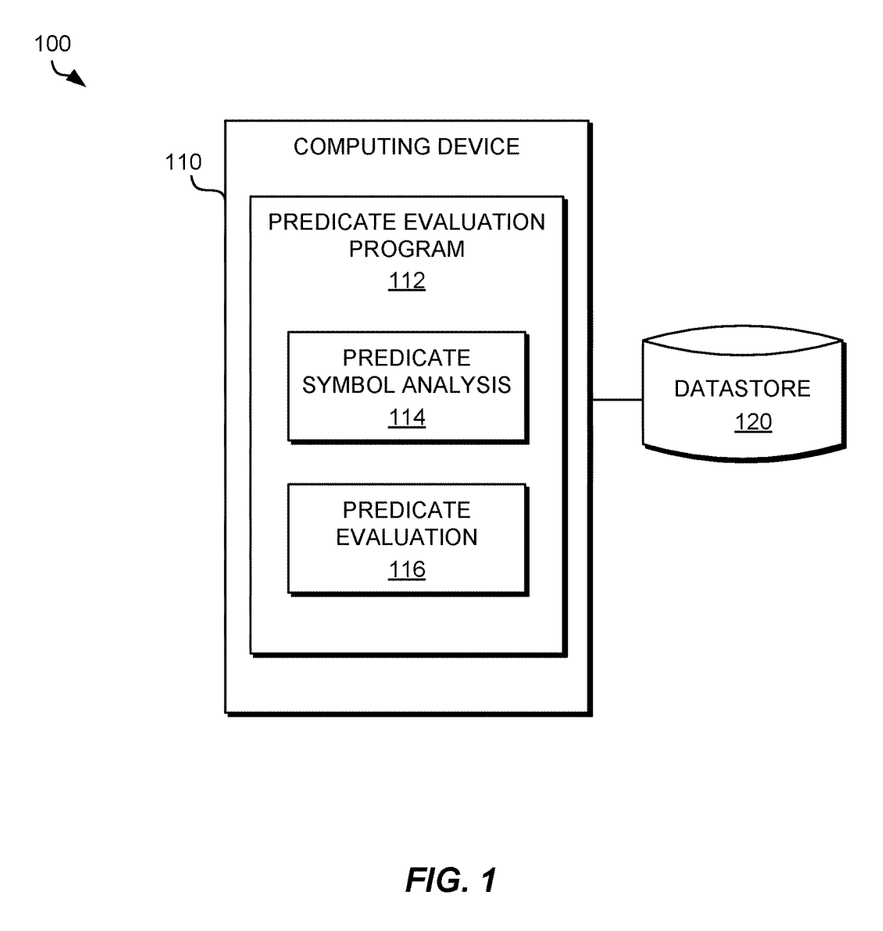
FIG. 1 is a system diagram of a predicate evaluation system, in accordance with an embodiment of the present invention.

FIG. 1 is a functional block diagram of a predicate evaluation system 100, in accordance with an embodiment of the present invention. Predicate evaluation system 100 includes computing device 110. Computing device 110 represents the computing environment or platform that hosts predicate evaluation program 112. In various embodiments, computing device 110 may be a laptop computer, netbook computer, personal computer (PC), a desktop computer, or any programmable electronic device capable of hosting predicate evaluation program 112, in accordance with embodiments of the invention. Computing device 110 may include internal and external hardware components, as depicted and described in further detail below with reference to FIG. 3.

Figure 3:
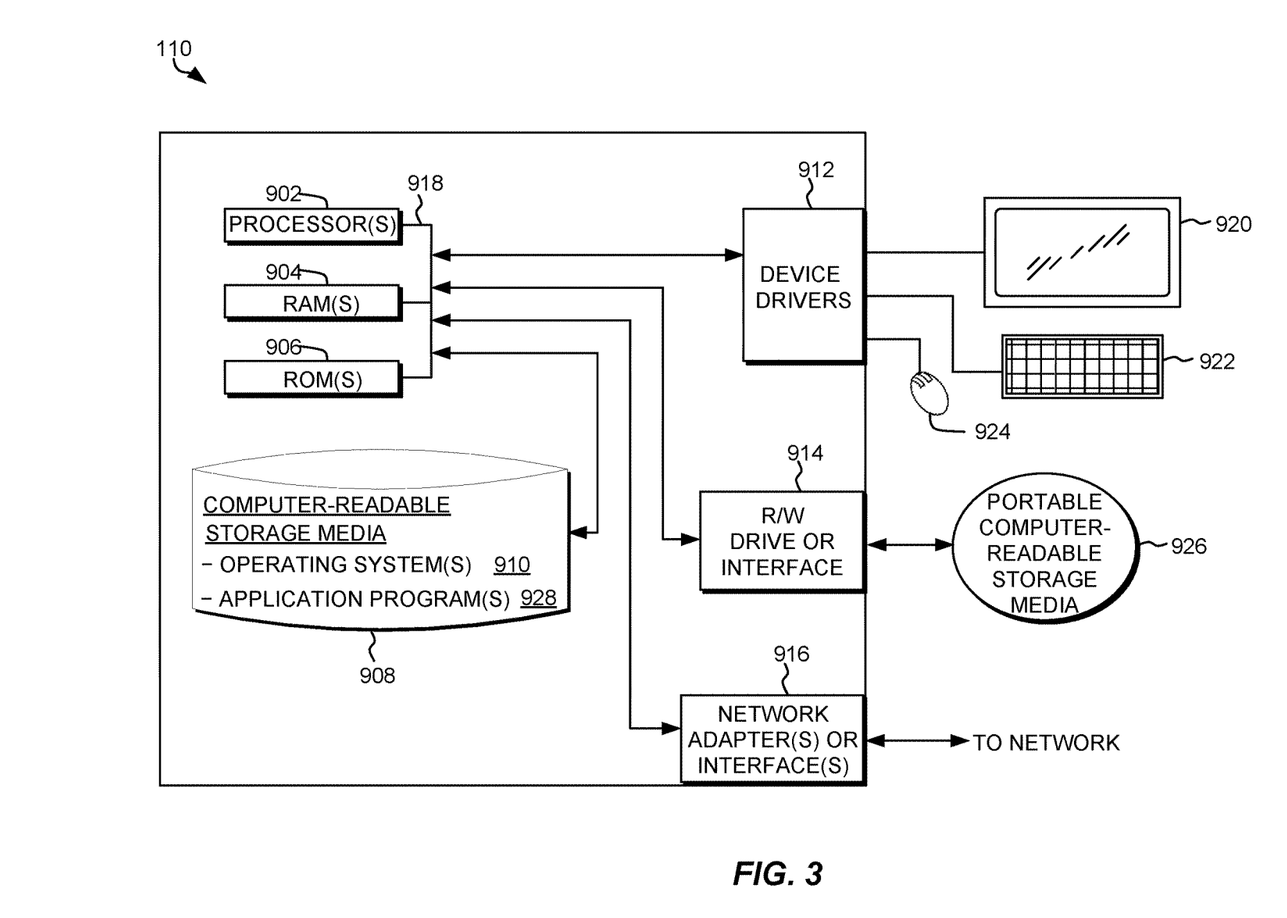
FIG. 3 is a functional block diagram illustrating a data processing environment, in accordance with an embodiment of the present invention.

Datastore 120 represents a store of data, including compressed text and/or a relational database with compressed data. Datastore 120 may also store compression dictionaries for the compressed text and/or compressed data. Datastore 120 may reside, for example, on computer readable storage media 908 (FIG. 3).

In an exemplary embodiment of the invention, computing device 110 includes predicate evaluation program 112 and datastore 120. Predicate evaluation program 112 may further include predicate symbol analysis module 114, and predicate evaluation module 116.

Predicate evaluation program 112 operates generally to receive a request to evaluate a match predicate, such as = or LIKE, against data in a compressed relational database, in accordance with an embodiment of the present invention. For a given part of a page in a database table, which may be an entire page, predicate evaluation program 112 compares a list of symbols in a compression dictionary for the page with another list of symbols whose compression strings partially match the given predicate value in order to determine whether a match is likely to occur on the page. If so, the page may be decompressed in order to evaluate the predicate; otherwise, it may be skipped. Alternatively, if a match is likely on the page, a search method that does not involve decompression may be used to evaluate the predicate.

Predicate symbol analysis module 114 operates to generate a list of compression symbols in the compression dictionary that at least partially match the received predicate value, in accordance with an embodiment of the present invention. A compression symbol is said to partially match a predicate value if its associated byte sequence either matches the predicate value, or contains a subsequence that matches the predicate value, or has suffix that matches a prefix of the predicate value, or has a prefix that matches a suffix of the predicate value. Predicate symbol analysis module 114 may scan entries in the compression dictionary and record any in a predicate symbol list that partially match the given predicate value in the sense described above. Predicate symbol analysis module 114 may store the predicate symbol list in datastore 120 for further processing.

Predicate evaluation module 116 operates generally to determine whether a match for the predicate value may be present in the received part of the page and, if so, evaluate the predicate on the part of the page, in accordance with an embodiment of the present invention. Predicate evaluation module 116 receives the predicate symbol list and the page symbol list from predicate symbol analysis module 114. By comparing the page symbol list with the predicate symbol list, predicate evaluation module 116 may determine that at least one compression symbol from the predicate symbol list is also present in the page symbol list, indicating that a match for the predicate value may be present in the received part of the page.

In an embodiment of the invention, predicate evaluation module 116 generates page symbol indicator data that indicates which compression symbols from the compression dictionary are present among the compression symbols in the page symbol list. Indicator data may be, for example, alphabetic, numeric, or alphanumeric strings, or Boolean values, such as 0/1 or Yes/No, indicating the presence or absence of compression symbols. For example, the page symbol indicator data may be a bit vector with bit positions corresponding to entries in the compression dictionary, such that a 1 bit in a bit position indicates the presence of a corresponding compression symbol in the page symbol list. In some embodiments, the bit vector may be constructed directly, without first creating a list, for example when the data on the page is compressed. Predicate evaluation module 116 may store the page symbol indicator data in datastore 120.

In an embodiment of the invention, predicate evaluation module 116 generates predicate symbol indicator data that indicates which compression symbols from the compression dictionary are present among the compression symbols in the predicate symbol list. For example, the predicate symbol indicator data may be a bit vector with bit positions corresponding to entries in the compression dictionary, such that a 1 bit in a bit position indicates the presence of a corresponding compression symbol in the predicate symbol list. In some embodiments, the bit vector may be constructed directly, without first creating a list. Predicate evaluation module 116 may store the predicate symbol indicator data in datastore 120.

By comparing the page symbol indicator data and the predicate symbol indicator data, predicate evaluation module 116 may determine that at least one compression symbol whose associated compression string at least partially matches the predicate value, as described above, may also be present in the received part of the page, indicating that a match for the predicate value may be present in the received part of the page. For example, if the predicate symbol indicator data and the page symbol indicator data are represented by bit vectors, as described above, then a match may be present if:

page symbol vector OR predicate symbol vector=predicate symbol vector.

Figure 2:
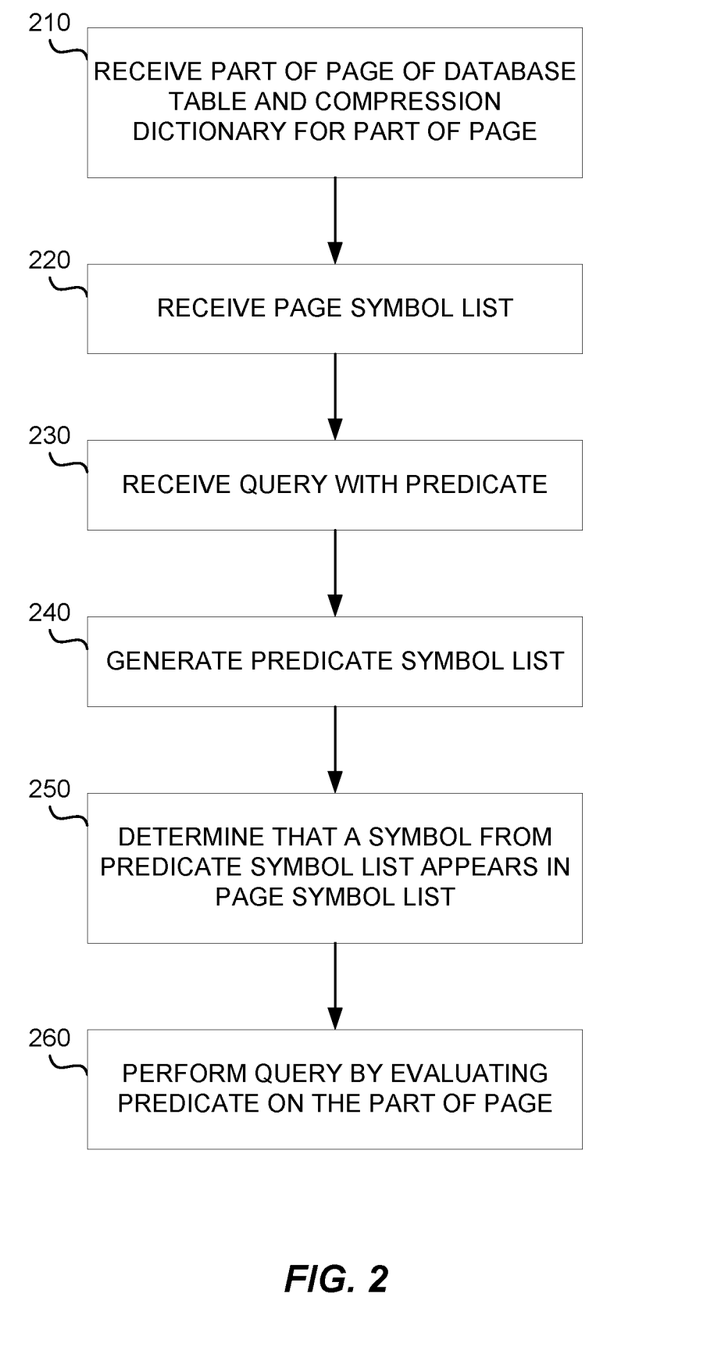
FIG. 2 is a flowchart depicting operational steps of a predicate evaluation program, in accordance with an embodiment of the present invention.

FIG. 2 is a flowchart depicting operational steps performed by computing device 110 in executing predicate evaluation program 112, in accordance with an embodiment of the invention. Predicate evaluation program 112 receives a page of a database table, or part of the page, along with a compression dictionary for at least the part of the page received (step 210). Predicate evaluation program 112 may receive a page symbol list, which includes compression symbols from the compression dictionary that are present in the part of the page received (step 220). Predicate evaluation program 112 receives a database query with a search condition having a match predicate (step 230). Predicate symbol analysis module 114 generates a predicate symbol list, which includes compression symbols whose associated byte sequences at least partially match the predicate value (step 240). Predicate evaluation module 116 determines that at least one compression symbol from the predicate symbol list appears in the page symbol list (step 250). Predicate evaluation module 116 performs the query by evaluating the predicate on the part of the page received.

FIG. 3 depicts a block diagram of components of a computing device 110, in accordance with an embodiment of the present invention. It should be appreciated that FIG. 3 provides only an illustration of one implementation and does not imply any limitations with regard to the environments in which different embodiments may be implemented. Many modifications to the depicted environment may be made.

Computing device 110 may include one or more processors 902, one or more computer-readable RAMs 904, one or more computer-readable ROMs 906, one or more computer readable storage media 908, device drivers 912, read/write drive or interface 914, network adapter or interface 916, all interconnected over a communications fabric 918. Communications fabric 918 may be implemented with any architecture designed for passing data and/or control information between processors (such as microprocessors, communications and network processors, etc.), system memory, peripheral devices, and any other hardware components within a system.

One or more operating systems 910, and one or more application programs 928, for example, predicate evaluation program 112, are stored on one or more of the computer readable storage media 908 for execution by one or more of the processors 902 via one or more of the respective RAMs 904 (which typically include cache memory). In the illustrated embodiment, each of the computer readable storage media 908 may be a magnetic disk storage device of an internal hard drive, CD-ROM, DVD, memory stick, magnetic tape, magnetic disk, optical disk, a semiconductor storage device such as RAM, ROM, EPROM, flash memory or any other computer-readable tangible storage device that can store a computer program and digital information.

Computing device 110 may also include a R/W drive or interface 914 to read from and write to one or more portable computer readable storage media 926. Application programs 928 on computing device 110 may be stored on one or more of the portable computer readable storage media 926, read via the respective R/W drive or interface 914 and loaded into the respective computer readable storage media 908.

Computing device 110 may also include a network adapter or interface 916, such as a TCP/IP adapter card or wireless communication adapter (such as a 4G wireless communication adapter using OFDMA technology). Application programs 928 on computing device 110 may be downloaded to the computing device from an external computer or external storage device via a network (for example, the Internet, a local area network or other wide area network or wireless network) and network adapter or interface 916. From the network adapter or interface 916, the programs may be loaded onto computer readable storage media 908. The network may comprise copper wires, optical fibers, wireless transmission, routers, firewalls, switches, gateway computers and/or edge servers.

Computing device 110 may also include a display screen 920, a keyboard or keypad 922, and a computer mouse or touchpad 924. Device drivers 912 interface to display screen 920 for imaging, to keyboard or keypad 922, to computer mouse or touchpad 924, and/or to display screen 920 for pressure sensing of alphanumeric character entry and user selections. The device drivers 912, R/W drive or interface 914 and network adapter or interface 916 may comprise hardware and software (stored on computer readable storage media 908 and/or ROM 906).

The present invention may be a system, a method, and/or a computer program product at any possible technical detail level of integration. The computer program product may include a non-transitory computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The foregoing description of various embodiments of the present invention has been presented for purposes of illustration and description. It is not intended to be exhaustive nor to limit the invention to the precise form disclosed. Many modifications and variations are possible. Such modification and variations that may be apparent to a person skilled in the art of the invention are intended to be included within the scope of the invention as defined by the accompanying claims.

What is claimed is:

1. A computer-implemented method comprising:
   compressing, by a computer, a page of a database table, whereby a compression dictionary is created, the compression dictionary comprising entries that include a byte sequence from the page and a compression symbol associated with the byte sequence;
   receiving, by the computer, a part of the compressed page and the compression dictionary;
   receiving, by the computer, a page symbol list, comprising compression symbols from the compression dictionary that are present in the part of the page;
   receiving, by the computer, a query, wherein the query includes a predicate having a predicate value;
   generating, by the computer, a predicate symbol list for the predicate, comprising compression symbols in the compression dictionary whose associated byte sequences at least partially match the predicate value;
   generating, by the computer, a page symbol indicator data, indicating which compression symbols from the compression dictionary are present among the compression symbols in the page symbol list;
   generating, by the computer, a predicate symbol indicator data, indicating which compression symbols from the compression dictionary are present among the compression symbols in the predicate symbol list;
   determining, by the computer, based on the page symbol indicator data and the predicate symbol indicator data, that at least one compression symbol from the predicate symbol list is also present in the part of the page;
   determining, by the computer, based on the predicate symbol list and the page symbol list, that at least one compression symbol from the predicate symbol list is also present in the part of the page; and
   performing, by the computer, the query, whereby the predicate is evaluated on the part of the page.

2. The method of claim 1, wherein the predicate symbol list for the predicate comprises compression symbols in the compression dictionary whose associated byte sequences: match the predicate value, or contain a subsequence that matches the predicate value, or have a suffix that matches a prefix of the predicate value, or have a prefix that matches a suffix of the predicate value.

3. The method of claim 1, wherein
   the page symbol indicator data comprises a first bit vector with bit positions corresponding to entries in the compression dictionary, wherein a 1 bit in a bit position of the first bit vector indicates the presence of a corresponding compression symbol in the part of the page; and wherein
   the predicate symbol indicator data comprises a second bit vector with bit positions corresponding to entries in the compression dictionary, wherein a 1 bit in a bit position of the second bit vector indicates the presence of a corresponding compression symbol among the compression symbols in the predicate symbol list; and wherein
   determining that at least one compression symbol from the predicate symbol list is also present in the part of the page comprises determining that the first bit vector has a 1 bit in at least one of the bit positions where the second bit vector has a 1 bit.

4. The method of claim 1, wherein
   the compression dictionary includes column indicator data, indicating, for each symbol in the compression dictionary which columns of the database table may include the symbol, and wherein
   the predicate symbol list comprises compression symbols in the compression dictionary for which the column indicator data indicates that the compression symbols may be present in a search column of the query, whose associated byte sequences:

match the predicate value, or contain a subsequence that matches the predicate value, or have a suffix that matches a prefix of the predicate value, or have a prefix that matches a suffix of the predicate value.

5. The method of claim 4, wherein the column indicator data comprises, for each compression symbol in the compression dictionary, a list of columns of the database table that may include the compression symbol.

6. The method of claim 4, wherein the column indicator data comprises a bit vector with bit positions corresponding to columns of the database table in which the compression symbol may appear.

* * * * *